United States Patent [19]

Mance

[11] Patent Number: 4,661,372

[45] Date of Patent: Apr. 28, 1987

[54] UV-INDUCED COPPER-CATALYZED ELECTROLESS DEPOSITION ONTO STYRENE-DERIVATIVE POLYMER SURFACE

[75] Inventor: Andrew M. Mance, Royal Oak, Mich.

[73] Assignee: General Motors Corporation, Detroit, Mich.

[21] Appl. No.: 812,833

[22] Filed: Dec. 23, 1985

[51] Int. Cl.$^4$ ............................................. C23C 18/20
[52] U.S. Cl. ................................... 427/54.1; 427/98; 427/250; 427/256; 427/306
[58] Field of Search ............... 427/54.1, 98, 306, 256, 427/250

[56] References Cited

U.S. PATENT DOCUMENTS

| | | | |
|---|---|---|---|
| 3,773,514 | 11/1973 | Fromson | 96/86 |
| 4,165,394 | 8/1979 | Ehrbar | 427/40 |
| 4,250,225 | 2/1981 | Shirahata et al. | 428/336 |
| 4,349,583 | 2/1982 | Kulynych | 427/53.1 |
| 4,354,911 | 10/1982 | Dodd et al. | 204/192 |
| 4,440,801 | 4/1984 | Aviram et al. | 427/54.1 |
| 4,568,562 | 2/1986 | Phillips | 427/40 |
| 4,574,095 | 3/1986 | Baum | 427/53.1 |

OTHER PUBLICATIONS

Kirk-Othmer, *Encyclopedia of Chemical Technology*, Third Edition, vol. 8, pp. 742–746.

*Primary Examiner*—John D. Smith
*Attorney, Agent, or Firm*—Douglas D. Fekete

[57] ABSTRACT

A method is described for depositing an electroless copper plate onto a region of a styrene-derivative polymer surface using a vacuum deposited copper catalyst. Prior to depositing the catalyst, the region is treated with ultraviolet radiation while exposed to air. It is found that the vacuum-deposited copper is active to catalyze electroless deposition onto the treated region, but not upon a similar region not subjected to the ultraviolet treatment.

4 Claims, No Drawings

4,661,372

UV-INDUCED COPPER-CATALYZED ELECTROLESS DEPOSITION ONTO STYRENE-DERIVATIVE POLYMER SURFACE

BACKGROUND OF THE INVENTION

This invention relates to electroless deposition of copper onto a styrene-derivative polymer using a vacuum deposited copper catalyst. More particularly, this invention relates to ultraviolet (UV) light treatment of the styrene-derivative polymer surface prior to vacuum deposition of a discontinuous thin copper film that renders the film active during subsequent electroless copper deposition. In one aspect of this invention, the ultraviolet light treatment is applied to a selected region of the polymer surface to produce a plate having a desired pattern.

A metal plate, such as copper or nickel plate, may be deposited onto a nonconductive polymer surface by electroless deposition. The plate is useful, for example, in the manufacture of a microelectronic circuit pattern. The plate may be applied and etched to remove unwanted metal and define the pattern. However, this necessitates a mask, such as a photolithographic mask, temporarily applied to the surface to protect the pattern from the etching media. Alternately, a mask may be applied to the surface prior to plating. In either case, additional steps are required to apply, develop and remove the mask. Thus, it is desired to avoid the steps for forming a mask on the polymer, while depositing the plate only onto areas that produce the pattern.

Prior to electroless deposition, a catalyst is applied to the surface. A common catalyst is formed by an aqueous colloidal suspension of tin and palladium particles. Alternately, it is known that a discontinuous thin film of copper may be suitable as a catalyst in some applications. However, for a substrate formed of a styrene-derivative polymer, such as polystyrene, acrylonitrile-butadiene-styrene (ABS) copolymer or poly(styrene-acrylonitrile) (SAN), vacuum-deposited copper is ineffective for catalyzing electroless deposition without pretreatment of the polymer surface. Wet chemistry treatments conventionally used with palladium-tin catalyst require masking to treat only the pattern regions and are therefore not desirable. I have found that exposure of a styrene-derivative polymer surface to ultraviolet light prior to vacuum deposition of a thin copper film produces a film on the exposed areas that is active for catalyzing electroless copper deposition, whereas the film applied to unexposed regions is not. This is surprising in part because a similar ultraviolet light treatment is not effective for activating a palladium-tin catalyst.

It is an object of my invention to provide an improved method for electroless deposition of a metal plate onto a styrene-derivative polymer surface using a vacuum-deposited metal catalyst, which method comprises ultraviolet irradiation of the styrene-derivative polymer surface prior to catalyst deposition to activate the catalyst for subsequent electroless deposition.

More particularly, it is an object of this invention to provide an improved method for applying an electroless copper plate onto selected surface regions of a styrene-derivative polymer, which method comprises exposing the regions to ultraviolet light and vacuum depositing a discontinuous thin copper film onto the entire surface, including both exposed and unexposed regions, whereupon the film is rendered active on exposed surfaces for catalyzing subsequent electroless deposition, but is inactive on unexposed surfaces. Thus, this ultaviolet light exposure may be conveniently controlled to restrict the metal plate to a desired pattern on the product surface. The plate is advantageously deposited using but a single wet chemistry step, that of electroless deposition, and without requiring additional steps for coating and developing a protective mask on the surface.

BRIEF DESCRIPTION OF THE INVENTION

In accordance with a preferred embodiment of this invention, selected regions of an injection molded styrene-derivative polymer surface are treated in preparation for electroless deposition of a copper plate by exposure to ultraviolet radiation in the presence of air. The polymer surface is initially in an as-molded condition. The ultraviolet radiation is characterized by a wavelength generally between about 240 and 280 nanometers and absorbable by the polymer. This irradiation causes photodegradation and a reaction with oxygen from the air to produce an oxidized surface. Thereafter, copper is vacuum deposited onto both exposed and unexposed regions in an amount insufficient to produce a continuous film, but rather producing a film comprising isolated copper clusters dispersed on the surface. The surface is then immersed in a suitable aqueous bath for electroless copper deposition. It is found that a continuous, adherent copper plate is formed on exposed regions of the polymer surface, but not on unexposed regions.

Thus, this invention provides a method for applying a copper plate having a desired pattern onto a styrene-derivative polymer surface. The pattern of the plate is determined by the pattern of ultraviolet exposure, which is conveniently controlled using a stencil. Thereafter, the entire surface, both exposed and unexposed regions, may be treated during the vacuum deposition and electroless deposition steps, while producing a plate only on the exposed regions. Thus, masking during the catalyst deposition step or the plate deposition step is avoided. Furthermore, the method is preferably carried out on an as-molded surface, without etching or other special pretreatments, and requires only a single wet chemistry step to produce the electroless plate.

DETAILED DESCRIPTION OF THE INVENTION

This invention is illustrated by reference to the following examples.

EXAMPLE 1

An electroless copper plate is applied to a selected surface region of an injection molded polystyrene panel. A suitable panel is molded of a polystyrene material purchased from Amoco Chemicals Corporation under the trade designation 1-G3 C2PS. The panel surface is suitably shielded so that only the region is exposed. The region is irradiated for approximately 30 minutes by ultraviolet radiation emitted by a low pressure mercury vapor lamp. The lamp emission spectrum exhibits an intensity maximum at a wavelength of about 254 nanometers. An air space of approximately 2 centimeters between the panel and the lamp provides air access to the surface.

A copper catalyst film is applied to the panel surface. Within a vacuum chamber, the specimen is positioned above a copper source with the panel surface to be plated facing the source. The vacuum chamber is evacuated to about $10^{-5}$ torr. The copper source is heated by a magnetically focused electron beam to vaporize the copper, whereupon copper vapors condense on the panel. An amount of copper is deposited that is sufficient to produce a uniform film having an average thickness of about 45 Angstroms. However, the resulting film is not uniform, but rather is formed of isolated copper deposits dispersed on the surface.

The panel is immersed in an aqueous electroless copper deposition bath comprising a copper salt and a formaldehyde reducing agent. A preferred bath is prepared from concentrates purchased from Shipley Chemical Company under the trade designation Crownplate Process PM-990. Electroless deposition is continued for a time sufficient to produce a continuous plate on the UV-exposed regions, but does not form a plate on unexposed regions.

EXAMPLE 2

The procedure described in Example 1 is repeated to apply a copper plate to a surface region of an injection molded SAN specimen. A suitable SAN panel is molded of a commercial material purchased from Dow Chemical Company under the trade designation Tyril 1000 Transparent SAN. The copper plate is applied to the region exposed to ultraviolet light and air, but not to regions that are covered during ultraviolet irradiation.

EXAMPLE 3

A copper plate is applied to a surface region of an injection molded ABS panel. A suitable panel is formed of a commercial material obtained from Dow Chemical Company under the trade designation Clear ABS XP 74031. While suitably covering the remainder of the surface, the selected region is exposed to a low pressure mercury vapor lamp in the presence of air for approximately 30 minutes, as in Example 1. A discontinuous thin copper catalyst film is vacuum deposited onto the surface as in Example 1. A continuous copper plate is formed on the irradiated region by immersing the panel in an electroless deposition bath formed of an ambient temperature aqueous solution containing 5 grams per liter copper sulfate, $CuSO_4.5H_2O$; 25 grams per liter sodium potassium tartrate, $KNaC_4H_4O_6.4H_2O$; 7 grams per liter sodium hydroxide, NaOH; and 10 milliliters per liter of a 37 percent formaldehyde solution. Copper is deposited onto the UV-irradiated region at a rate of approximately 0.75 microns per hour for approximately 8 minutes to produce continuous, adherent copper plate on the region. No deposit is observed on regions not exposed to ultraviolet light.

As shown in the examples, a copper plate is electrolessly deposited in accordance with this invention on surface regions of a styrene-derivative polymer that are initially irradiated by absorbable ultraviolet light in the presence of air. The light has sufficient intensity to cause significant polymer photodegradation within a practical time and, when carried out in the presence of oxygen, produces an oxidized surface. Thereafter, a catalyst film formed of discrete copper clusters is deposited on the polymer surface. While not limited to any particular theory, it is believed that copper atoms that condense on the polymer surface are mobile, permitting the atoms to accumulate to form clusters. Small clusters aggregate into larger clusters. This mobility is believed to be reduced on the oxidized surface formed by ultraviolet treatment in the presence of ambient oxygen in accordance with this invention. As a result, the clusters on a treated surface are more numerous and have a relatively smaller size in comparison to clusters on an untreated surface. Thereafter, when a surface bearing the clusters is brought into contact with an electroless copper deposition bath comprising a reducible copper salt and a reducing agent such as formaldehyde, the copper clusters decompose the reducing agent to an intermediate species effective for reducing the copper ions, whereupon copper metal precipitates onto the surface, as is known for conventional electroless deposition. In this manner, catalysis by the copper cluster initiates deposition of electroless copper, which deposit in turn catalyzes additional deposition, causing the deposit to grow and merge with adjacent deposits to produce a continuous plate. For reasons that are not fully understood, large clusters formed on untreated styrene-derivative polymer surface are ineffective for catalyzing electroless copper deposition. In contrast, copper clusters that are formed on a surface exposed to ultraviolet light in the presence of ambient oxygen in accordance with this invention are highly effective for catalyzing electroless deposition.

The method of this invention is suitable for depositing an electroless copper plate on a polymer formed from styrene monomer, preferably polystyrene, styrene-acrylonitrile copolymer, and acrylonitrile-butadiene-styrene copolymer, as in the described examples. The polymer surface is irradiated with ultraviolet light having a wavelength suitable for absorption by the polymer. It is found that such styrene-derivative polymers have a suitable absorption range between about 240 and 280 nanometers and a maximum at about 259 nanometers. A preferred ultraviolet source is the mercury vapor lamp in the described examples emitting a spectrum having an intensity maximum at about 254 nanometers, corresponding approximately to the maximum polymer absorption wavelength of about 259 nanometers. While this invention has been described using an ultraviolet lamp producing a broad spectrum in the ultraviolet light region, it may be suitably carried out utilizing ultraviolet light from other sources, including a laser that emits light at a predetermined wavelength within the desired wavelength range. A focused laser beam may be suitably scanned across selected regions of the surface to treat the regions without the necessity of covering regions where no plate is desired.

This invention has been described using a vacuum-deposited discontinuous copper film as an electroless deposition catalyst. A suitable discontinuous film is formed of copper in an amount sufficient to produce an average thickness, calculated as if a continuous film, of less than about 50 Angstroms. Copper is relatively inexpensive and is preferred as the catalyst. Alternately, a noble metal such as silver, gold, platinum or palladium is suitable to catalyze electroless copper deposition. The method may be also carried out to deposit an electroless nickel plate utilizing a vacuum deposited nickel catalyst.

While in the described embodiment the discontinuous thin catalyst film is applied onto the ultraviolet treated surface without intervening steps, the irradiated surface may be suitably treated by immersion in aqueous alkaline solution prior to catalyst deposition. Such alkaline treatment, although requiring an additional wet chemistry step, may improve plate adhesion and appearance.

While this invention has been described in terms of certain examples thereof, it is not intended that it be limited to the above description but rather only to the extent set forth in the claims that follow.

The embodiments of the invention in which an exclusive property or privilege is clamed are defined as follows:

1. A method for depositing a copper plate onto a selected region of a surface of an injection molded polymer selected from the group consisting of polystyrene, styrene-acrylonitrile copolymer and acrylonitrile-butadiene-styrene copolymer, said method comprising
   irradiating the region with ultraviolet radiation having a wavelength between about 240 and 280 nanometers, said irradiation being carried out while said surface is exposed to air to produce an oxidized surface,
   vacuum depositing copper onto the surface to produce a discontinuous thin copper film, and
   electrolessly depositing a copper plate onto said region by contact with an electroless deposition solution, said electroless deposition being catalyzed by said vacuum-deposited copper film on said irradiated surface.

2. A method for depositing a continuous metal plate onto a surface region of a styrene-derivative polymer substrate, said method comprising
   irradiating the region while exposed to oxygen with polymer-absorbable ultraviolet radiation to produce an oxidized polymer surface,
   depositing a suitable catalyst metal for electroless plate deposition by exposing said substrate to vapors of said catalyst metal and condensing said vapors onto said irradiated region to form a discontinuous thin film comprising discrete metal clusters effective for catalyzing electroless deposition, and
   treating the catalyst-bearing irradiated region with a suitable solution containing the plate metal to electrolessly deposit metal onto said region to produce a continuous plate.

3. A method for depositing a continuous metal plate onto a selected surface region of a styrene-derivative polymer substrate, but not onto an adjacent surface region of said substrate, said method comprising
   irradiating the selected region with polymer-absorbable ultraviolet radiation in the presence of reactive oxygen under conditions sufficient to produce an oxidized surface while avoiding irradiation of the adjacent region so as to avoid oxidation thereof,
   vapor depositing a discontinuous thin film of a catalyst metal selected from the group consisting of copper, silver, gold, palladium, platinum and nickel onto both the selected region and the adjacent region, said film forming metal clusters effective for catalyzing electroless deposition on said selected region, and
   treating both said selected region and said adjacent region with an electroless metal deposition solution under conditions suitable to deposit a continuous metal film, whereupon a continuous metal film deposits onto said selected region as a result of said catalyst clusters, but does not deposit onto said adjacent region.

4. A method for depositing a copper plate onto a selected region of a surface of an injection molded polymer selected from the group consisting of polystyrene, styrene-acrylonitrile copolymer and acrylonitrile-butadiene-styrene copolymer, said method comprising
   irradiating the region with ultraviolet radiation having a wavelength between about 240 and 280 nanometers, said irradiation being carried out while said surface is exposed to air to produce an oxidized surface,
   treating the surface with an aqueous alkaline solution,
   vacuum depositing copper onto the surface to produce a discontinuous thin copper film, and
   treating the surface with a suitable aqueous copper-containing solution to electrolessly deposit copper onto the irradiated region, said electroless copper deposition being catalyzed by the vacuum-deposited copper film on said region.

* * * * *